(12) United States Patent
Kurahashi et al.

(10) Patent No.: US 8,896,316 B2
(45) Date of Patent: Nov. 25, 2014

(54) DEVICE HAVING CAPACITIVE LOADS AND ABNORMALITY DETECTING METHOD THEREOF

(75) Inventors: Kazutoshi Kurahashi, Chiyoda-ku (JP);
Takashi Kumagai, Chiyoda-ku (JP);
Taichiro Tamida, Chiyoda-ku (JP);
Hajime Nakatani, Chiyoda-ku (JP);
Daisuke Takauchi, Chiyoda-ku (JP)

(73) Assignee: Mitsubshi Electric Corporation, Chiyoda-Ku, Tokyo (JP)

( * ) Notice: Subject to any disclaimer, the term of this patent is extended or adjusted under 35 U.S.C. 154(b) by 16 days.

(21) Appl. No.: 13/582,661

(22) PCT Filed: Jun. 17, 2010

(86) PCT No.: PCT/JP2010/060284
§ 371 (c)(1),
(2), (4) Date: Sep. 4, 2012

(87) PCT Pub. No.: WO2011/158361
PCT Pub. Date: Dec. 22, 2011

(65) Prior Publication Data
US 2012/0319696 A1    Dec. 20, 2012

(51) Int. Cl.
*G01R 31/00*    (2006.01)
*C01B 13/11*    (2006.01)
*G01R 31/327*   (2006.01)
*G01R 35/00*    (2006.01)
*G01R 19/25*    (2006.01)
*H01H 31/02*    (2006.01)
*G01R 31/02*    (2006.01)

(52) U.S. Cl.
CPC ............ *C01B 13/11* (2013.01); *G01R 31/3277* (2013.01); *G01R 35/00* (2013.01); *G01R 19/2513* (2013.01); *G01R 31/025* (2013.01)
USPC .......................................... 324/500; 324/555

(58) Field of Classification Search
CPC ........... G01R 19/2513; G01R 31/3277; G01R 35/00; G01R 31/025; H02H 1/0015; C01B 13/11
USPC ........... 324/500, 548, 76.11–76.83, 418, 434, 324/522, 533, 537, 538, 750.01, 761.01, 60, 324/503, 508, 509, 512, 541, 544, 551, 324/691–724, 555; 422/186.5, 186.15, 422/186.16, 186.28; 702/58, 57, 64, 85, 702/108, 127, 59, 185, 183, 182; 340/649, 340/650, 3.42, 3.43, 3.44, 292
See application file for complete search history.

(56) References Cited

U.S. PATENT DOCUMENTS 3,916,309 A * 10/1975 Foulkes et al. ............. 324/103 P
4,401,942 A *  8/1983 Renz .............................. 324/679
(Continued)

FOREIGN PATENT DOCUMENTS

CN    101292320 A    10/2008
EP    0884665 A1    12/1998
(Continued)

OTHER PUBLICATIONS

International Search Report (PCT/ISA/210) issued on Aug. 17, 2010, by the Japanese Patent Office as the International Searching Authority for International Application No. PCT/JP2010/060284.

(Continued)

*Primary Examiner* — Huy Q Phan
*Assistant Examiner* — Raul Rios Russo
(74) *Attorney, Agent, or Firm* — Buchanan Ingersoll & Rooney PC (57) ABSTRACT

In a device having capacitive loads in which a plurality of capacitive loads are connected in parallel, power is supplied from an AC power source to a load group comprising the plurality of capacitive loads, the load group is divided into a plurality of small load groups, and a current detecting sensor for detecting a current which flows in at least one small load group at a side which is closer to the load side than a branch point at which the load group is divided into the plurality of small load groups and a current abnormality detecting part for determining an abnormality of a load by a current detecting signal which is detected by the current detecting sensor are equipped.

4 Claims, 11 Drawing Sheets

(56) References Cited

U.S. PATENT DOCUMENTS

| | | | |
|---|---|---|---|
| 4,425,541 A * | 1/1984 | Burkum et al. | 324/548 |
| 5,916,130 A * | 6/1999 | Nakae et al. | 60/276 |
| 6,143,256 A | 11/2000 | Shinagawa et al. | |
| 6,160,414 A * | 12/2000 | Matsubara et al. | 324/537 |
| 6,181,113 B1 * | 1/2001 | Hu et al. | 323/209 |
| 7,224,142 B2 * | 5/2007 | Asaumi et al. | 320/104 |
| 2007/0086146 A1 * | 4/2007 | Timmerman et al. | 361/434 |
| 2008/0013227 A1 | 1/2008 | Mernyk et al. | |
| 2010/0128505 A1 * | 5/2010 | Leppanen et al. | 363/131 |

FOREIGN PATENT DOCUMENTS

| | | |
|---|---|---|
| JP | 1-136468 U | 9/1989 |
| JP | 05-157788 A | 6/1993 |
| JP | 9-059005 A | 3/1997 |
| JP | 11-029306 A | 2/1999 |
| JP | 2001-037071 A | 2/2001 |
| JP | 2007-217237 A | 8/2007 |
| JP | 2007217237 A | 8/2007 |

OTHER PUBLICATIONS

Written Opinion (PCT/ISA/237) issued on Aug. 17, 2010, by the Japanese Patent Office as the International Searching Authority for International Application No. PCT/JP2010/060284.

Office Action from the Japan Patent Office dated Dec. 3, 2013, issued in corresponding Japanese Patent Application No. 2012-520219, with English translation thereof. (6 pages).

Office Action from Chinese Patent Office date Apr. 22, 2014, issued in corresponding Chinese Patent Application No. 201080067438.1, with English translation thereof. (15 pages).

* cited by examiner

DEVICE HAVING CAPACITIVE LOADS AND ABNORMALITY DETECTING METHOD THEREOF

TECHNICAL FIELD

This invention relates to a device having capacitive loads in which a plurality of capacitive loads are connected to an AC power source and a method for detecting the abnormal current, in a case where a part of loads of the device become the abnormal state such as a short circuit.

BACKGROUND ART

Generally in a case where an abnormal current flows due to failure of a load of a device such as a short circuit, the load and a power source are protected by a method of cutting a power source by detecting the abnormal current or that of inserting a fuse which is flown by an abnormal current between the power source and the load. More than 100 pieces of discharge tubes are used to connect to an AC power source in an ozone generating device of a large capacity. In the ozone generating device having the above-mentioned configuration, due to the variation of discharge tubes, short-circuit discharge is generated in one piece of discharge tubes, and arc discharge may be generated in the discharge tube. In occurrence of the above-mentioned abnormality, in order to protect other loads and a power source, or to continue the operation, various kinds of technologies have been proposed.

For example, in an ozone generating device comprising a plurality of discharging elements, in a case where one or a plurality of discharging elements become abnormal in operation, the abnormality of the discharging element is detected by each abnormality detecting means which is connected to each discharging element, and then the output power of ac power circuit is decreased to a predetermined output power value. As a result, the electric current as to be overloaded to the other normal discharging elements does not flow after electrically separating the discharging element having the abnormality, and thereby the normal discharging elements are prevented from being destroyed in succession and the operation is continued by the remaining discharging elements without interrupting the generation of the ozone. (Patent Document 1)

Further in an ozone generating device comprising a discharging tube comprising a glass tube wherein the discharging tube is connected to an output of an inverter, when an abnormality is generated, such as breakage of a glass tube, an output circuit at a first voltage V1 which outputs a voltage drop with a first time constant and an output circuit at a second voltage V2 which outputs a voltage drop with a second time constant slower than the first time constant are equipped and a comparator which is connected to the above circuits outputs an abnormality occurrence signal when the second voltage V2 is higher than the first voltage V1. (Patent Document 2)

PRIOR ART DOCUMENT

Patent Document

Patent Document 1: Japanese Patent Application Laid-Open No. 11-29306

Patent Document 2: Japanese Patent Application Laid-Open No. 2007-217237

DISCLOSURE OF THE INVENTION

Problems to be Solved by the Invention

According to the device disclosed by Patent Document 1, it is necessary to provide abnormality detecting means at each discharging element. Therefore, in a case where many discharging elements are connected, for example, an ozone generating device of a large volume, many abnormality detecting means are required. As a result, the configuration of the device is complicated.

Further, according to the technology disclosed by Patent Document 2, the abnormality is determined by decrease of voltage. Therefore, when the above-mentioned technology is applied to a device comprising many glass tubes wherein the glass tubes are connected to output of an inverter, such as an ozone generating device of large volume, there is a problem. That is, when only one glass tube is broken, decrease of voltage is small. Therefore, it is difficult to detect the abnormality.

In order to solve the above-mentioned problem, this invention was made. This invention aims to provide a device which can detect the abnormality with a simple configuration, in a device in which many loads are connected to an AC power source, especially, in a device in which many capacitive loads are connected to an AC power source such as an ozonizer of a large volume.

Means for Solving the Problems

In a device having capacitive loads according to this invention, a plurality of capacitive loads are connected in parallel, power is supplied from an AC power source to a load group comprising the plurality of capacitive loads, the load group is divided into a plurality of small load groups, and a current detecting sensor which detects a current which flows in at least one small load group at a side which is closer to the load side than a branch point at which the load group is divided into the plurality of small load groups and a current detecting part for determining an abnormality of a load by a current detecting signal which is detected by the current detecting sensor are equipped. Further, a method for detecting an abnormality in the device having capacitive loads according to this invention is a method for detecting an abnormality of the device having capacitive loads in which a plurality of capacitive loads are connected in parallel and power is supplied from an AC power source to a load group comprising the plurality of loads, by dividing the load group into a plurality of small load groups and by detecting a current which flows into at least one of the plurality of small load groups, in a case where an abnormality is generated in the current, the method determines such that an abnormality is generated in any of load in the small load groups.

Advantage of the Invention

A device having capacitive loads according to this invention is configured as above-mentioned. Therefore, the abnormality can be surely detected with a simple configuration.

EMBODIMENTS FOR CARRYING OUT THE INVENTION

Embodiment 1

Figure 1:
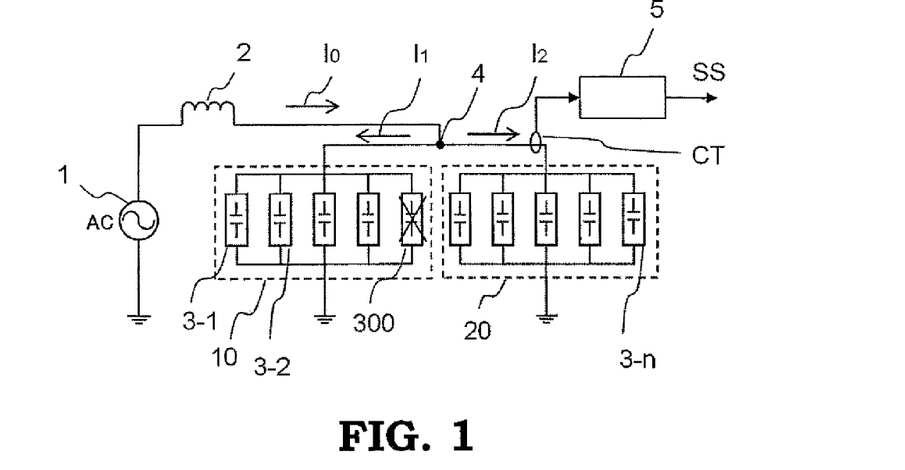
FIG. 1 is a circuit diagram showing the outline configuration of a device having capacitive loads according to Embodiment 1 of this invention.

FIG. 1 is a circuit diagram showing the outline configuration of a device having capacitive loads according to Embodiment 1 of this invention. In FIG. 1, the reference character 1 indicates an AC power source which generates a high-frequency AC such as an inverter, the reference character 2 indicates a reactor, the reference character 3-1, 3-2, and 3-$n$ indicate n pieces of loads which are provided, for example, in a case of an ozone generating device comprising a plurality of discharge tubes, each discharging tube is indicated. Alternately, whole load may be collectively indicated as a load group 3. FIG. 1 shows an example in which n=10. The reference character 10 indicates a first small load group comprising five loads out of ten loads and the reference character 20 indicates a second small load group comprising remaining five loads. Electric power is provided to the first small load group 10 and the second small load group 20 from an AC power source via a branch point 4, respectively. The reference character CT indicates a current detecting sensor which detects a current which flows in the second small load group 20 and the reference character 5 indicates a current abnormality detecting part which determines an abnormality of current by a current signal which is detected by the current detecting sensor CT. When the current abnormality detecting part 5 determines the abnormality, an abnormality occurrence signal SS is outputted. The abnormality occurrence signal SS is inputted to the AC power source 1, and in a case of abnormality, control operation such as decreasing an output voltage of the AC power source 1, stopping the AC power source, or re-starting the power source after a lapse of a specific time period after the power source is stopped once is performed.

Hereinafter, a case in which a load group 3 is a group comprising many discharging tubes of an ozone generating device will be described. The discharging tube of an ozone generating device is configured as follows. The discharging tube comprises a dielectric tube such as a glass tube having—a metallic film as a high-voltage electrode formed on an inner surface of the dielectric tube. The glass tube is inserted in a metallic tube whose inner diameter is larger than an outer diameter of the glass tube, and gas containing oxygen is allowed to flow through the gap between an outer surface of the glass tube and an inner surface of the metallic tube. By applying a high AC voltage between the metallic film as a high voltage electrode and the metallic tube, the gas in the gap is discharged so as to ozonize the oxygen. For example, in a case where the ozone generating device is used for water processing of water supply, the amount of water for water processing is large. Therefore, the amount of ozone which is required for processing is also large. Consequently, an ozone generating device of large volume is required. Regarding ozone generating devices of large volume, one device has several hundred pieces of discharging tubes, in some cases; one device has more than thousand pieces of discharging tubes. In FIG. 1, for explanation, a case in which ten pieces of discharging tubes are provided as a load, however, in practice, as above-mentioned, a case in which enormous numbers of loads are connected is not uncommon, for example, n=1000.

As above mentioned, in an ozone generating device, so-called silent discharge is applied. That is, an AC voltage is applied to gas via a dielectric substance as a glass tube so as to generate discharge. AC frequency to be applied is in a range between approximately several hundreds of Hz to 10 kHz, and voltage as a peak value is in a range between approximately 5 to 12 kV. Regarding silent discharge, when a discharging tube is viewed from a power source, a current is supplied to a discharge part via a dielectric substance. Therefore, a load is a capacitive load. Consequently, in FIG. 1, each load such as load 3-1 is indicated including capacity, that is, including a capacitor.

Hereinafter, with reference to FIG. 1, the operation of a device to which many discharging tubes, that is, capacitive loads are connected will be described. As shown in FIG. 1, a current which flows in the first small load group 10, that is, a current which passes through the branch point 4 and flows in the first small load group 10 is indicated as $I_1$, and a current which flows in the second small load group 20, that is, a current which passes through the branch point 4 and flows in the second small load group 20 is indicated as $I_2$. Further, a current which flows from the AC power source 1, passes through a reactor 2 and flows into the branch point 4, that is, a current which flows from the power source to whole of the first small load group 10 and the second small load group 20 is indicated as $I_0$. In a case where discharging tubes are normal, in accordance with an AC voltage which is applied from the AC power source 1 to loads 3-1 to 3-$n$ via the reactor 2, in discharging tubes as loads, discharges are generated and AC currents flow. A discharging tube as a load performs non-linear operation. Therefore, even if a voltage of a power source is a sine wave, a current which flows does not become a sine wave in accordance with a voltage which is applied but becomes a distorted wave form. However, here, for simplicity, a current will be described as a sine wave.

Figure 2:
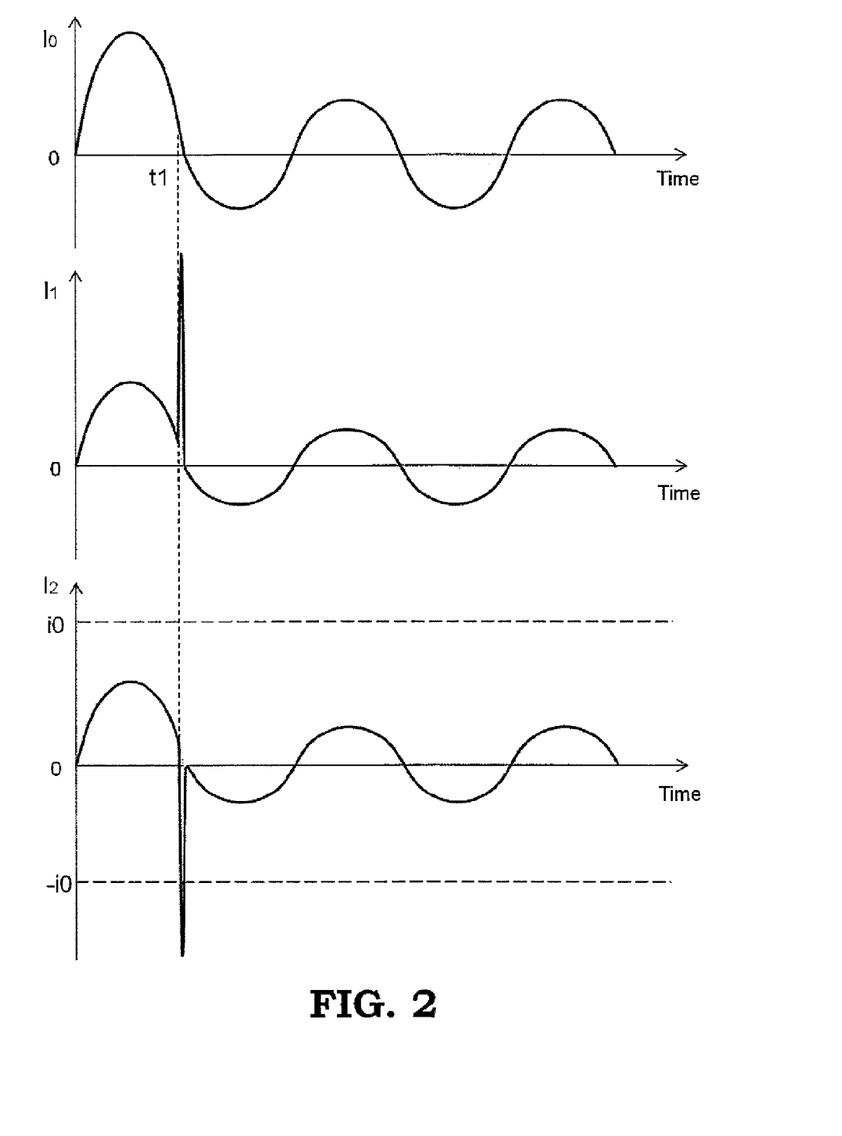
FIG. 2 is a schematic diagram for describing an operation of the device having capacitive loads according to Embodiment 1 of this invention.

It is assumed such that one of a plurality of discharge tubes is broken due to some causes, and arc discharge is generated in the discharging tube which is broken so as to generate a failure of short circuit. For example, typical current waveforms, when a failure of short circuit is generated in a load 300 which is one of loads in the first small load group 10 shown in FIG. 1, are shown in FIG. 2. In FIG. 2, from the top, a wave form of $I_0$, that of $I_1$ and that of $I_2$ are shown. When a short circuit is generated in the load 300 at time t1, charge which is stored in other loads is flown into the load 300. Therefore, as shown in FIG. 2, in the $I_1$, a rush current which flows into the load 300 is generated, and in the $I_2$, a rush current, that is charges which are stored in the second small load group 20 flow into the load 300, is generated. On the other hand, regarding the $I_0$, since there is a reactor 2, a sudden rush current is hardly generated. Further, in FIG. 1, under a resonance condition with the AC power source 1, the reactor 2 and all loads, a voltage is applied. The above-mentioned condition is set in order to increase a voltage to be applied to a load. When one load becomes a circuit-shorted state, a resonance condition is not satisfied, therefore, a voltage to be applied to the loads is decreased, and after the time t1, a current which flows from the power source is decreased.

In Embodiment 1, a current detecting sensor CT is provided so as to detect the current $I_2$ which flows in the second small load group 20. In this case, a wave form which is shown in the bottom of FIG. 2 is detected, even if a short circuit is generated in one load in the first small load group 10, a short circuit which is generated in one load in the first small load group 10 can be detected by the current detecting sensor CT which detects the current $I_2$ which flows in the second small load group 20. Patent Document 1 discloses the technology such that a current detecting means is provided at each discharging element and when a detected value by the current detecting means exceeds a predetermined value, it is determined such that an abnormality is generated in the each discharging element in which the current detecting means is provided. Conventionally, as stated in Patent Document 1, it was believed such that each abnormality of numerous discharging elements can be detected only by detecting a current which flows in the discharging element. However, inventors of this invention found out the phenomenon such that in a device to which a plurality of capacitive loads are connected in parallel such as an ozone generating device, in a case where a failure of short circuit such as discharge breakdown is generated in one load, charges are flown from other loads to a load in which a failure is generated. Then the inventors found out such that even if a current of each load is not detected, an abnormality can be detected by detecting a current which flows from a load in which a failure is not generated to a load in which a failure is generated.

As above-mentioned, in a case where an abnormality of short circuit is generated in one load of the first small load group 10, the current detecting sensor CT detects a waveform of I2 which is shown in FIG. 2. Based on the signal of the current waveform, in a case where a current abnormality detecting part 5 detects a current having a threshold value which is larger than the predetermined threshold value 10 shown by horizontal broken line in FIG. 2, for example, as an absolute value, it determines such that an abnormality is generated and an abnormality occurrence signal SS is outputted. By the abnormality occurrence signal SS, for example, by performing control such as decreasing the level of an output of the AC power source 1 or stopping the output of the AC power source, any influence on the power source or a load other than a load in which a failure is generated can be prevented.

Further, in FIG. 1 and FIG. 2, a case where a short-circuited failure is generated in one load in the first small load group 10 was described, however, in a case where a short-circuited failure is generated in one load in the second small load group 20, a waveform of $I_2$ becomes a waveform shown as $I_1$ in FIG. 2, and a waveform of $I_1$ becomes a waveform shown as $I_2$ in FIG. 2. In the $I_2$, a rush current, which flows into a load having a short-circuited failure, is generated, based on a signal of a current detecting sensor CT in FIG. 1, that is, a signal of a current detecting sensor CT which detects a current $I_2$ in the second small load group 20, occurrence of an abnormality can be determined in the current abnormality detecting part 5.

In FIG. 1, the number of loads of the first small load group 10 and that of the second small load group 20 are made equal, however, it is not necessary to make the number of each small load group, equal. Even if the number of loads is not equal, charges, which are stored in other small load group, flow into a small load group including a load having a failure, and a rush current is generated. Therefore, in the same way as that was described in the above, an abnormality occurrence can be determined.

As above-mentioned, according to Embodiment 1 of this invention, in a device in which a plurality of capacitive loads are connected in parallel, the load group which is a block of a plurality of capacitive loads are divided into two small load groups, that is, in FIG. 1, the load group is divided into the first load group 10 and the second load group 20, by detecting a current which flows in at least one small load group at a side which is closer to the load side than the branch point 4 by which a current from the AC power source 1 is separately supplied to two small load groups, when an abnormality of a short-circuit failure in any small load group is generated, the abnormality can be determined.

In the above, a method for applying a voltage utilizing the resonance, which is generated with the AC power source 1, the reactor 2 and the load group 3, was described; however, a method for applying a voltage from the AC power source 1 to the load group 3 without utilizing the resonance may be acceptable. Further, a method for applying a voltage from an AC power source via a reactor without utilizing the resonance may be also acceptable. Consequently, any of method for applying a voltage may be acceptable.

Embodiment 2

Figure 3:
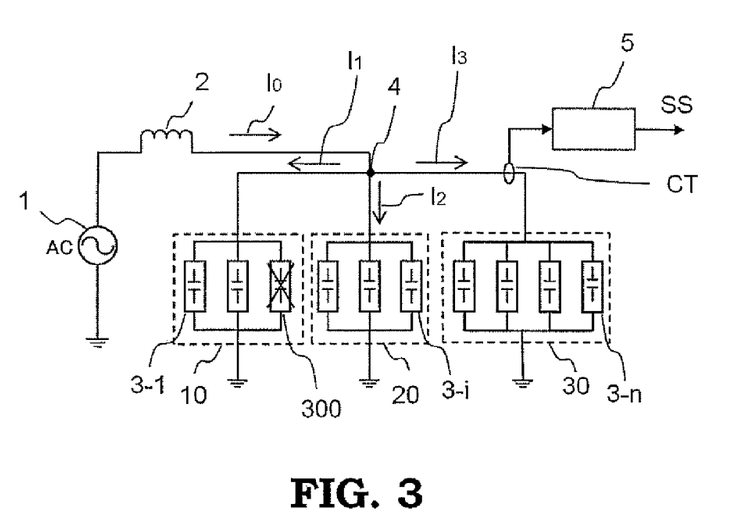
FIG. 3 is a circuit diagram showing the outline configuration of a device having capacitive loads according to Embodiment 2 of this invention.

FIG. 3 is a circuit diagram showing the outline configuration of a device having capacitive loads according to Embodiment 2 of this invention. In FIG. 3, the reference character which is same as that of FIG. 1 shows the same part or a corresponding part. In Embodiment 2 of this invention, a load group is divided into three small load groups, that is, a first small load group 10, a second small load group 20 and a third small load group 30, and power is supplied from an AC power source 1 to individual small load groups via a branch point 4. Further, a current detecting sensor CT is provided so as to detect a current which flows in the third small load group 30.

Figure 4:
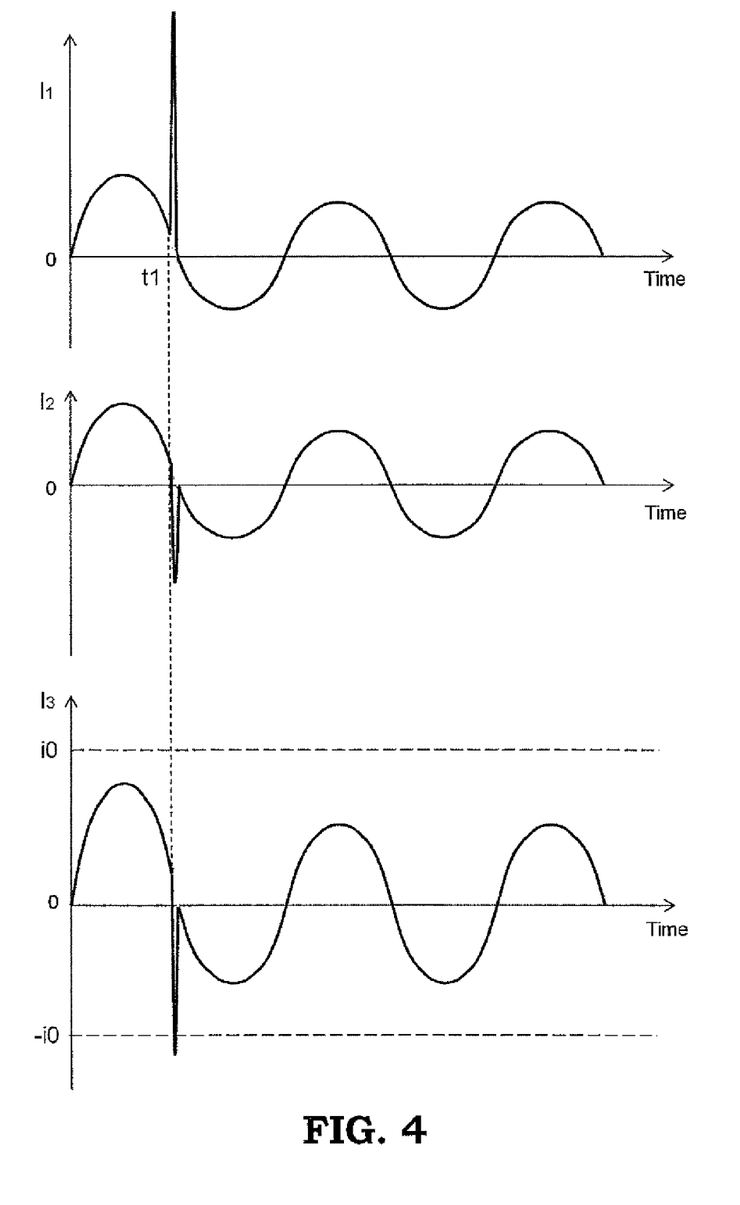
FIG. 4 is a schematic diagram for describing an operation of the device having capacitive loads according to Embodiment 2 of this invention.

FIG. 4 shows wave forms of a current which flows in three small load groups shown in FIG. 3. That is, a waveform of a current shown in the top of FIG. 4 is a waveform of a current $I_1$ which flows in the first small load group 10, a waveform of a current shown in the middle of FIG. 4 is a waveform of a current $I_2$ which flows in the second small load group 20, and a waveform of a current shown in the bottom of FIG. 4 is a waveform of a current $I_3$ which flows in the third small load group 30. In FIG. 4, waveforms of $I_1$, $I_2$ and $I_3$ in a case where a load 300 which is one load in the first small load group 10 is short-circuited at time t1. As shown in FIG. 4, at time t1, the load 300 is broken by short-circuiting, and a rush current flows as the current $I_1$ of the first small load group 10. Further, in the current $I_2$ of the second small load group 20, a charge which is stored in the second small load group 20 flows into the load 300 so as to generate a rush current. In the same way, in the current I3 of the third small load group 30, a charge which is stored in the third small load group 30 flows into the load 300 so as to generate a rush current.

As the above-mentioned, in a case where an abnormality of short-circuiting in the load 300 which is one load in the first small load group 10 is generated, a current detecting sensor CT which detects a current in the third small load group 30 detects a waveform such as $I_3$ shown in FIG. 4. Based on the signal of the current waveform, in a case where a current abnormality detecting part 5 detects a current having a threshold value which is larger than the predetermined threshold value i0 shown by a horizontal broken line in FIG. 4 as an absolute value, it determines such that an abnormality is generated and an abnormality occurrence signal SS is outputted. By abnormality occurrence signal SS, for example, by performing control such as decreasing the level of an output of the AC power source 1 or stopping the output of the AC power source, any influence on the power source or a load other than a load in which a failure is generated can be prevented.

Further, in FIG. 3 and FIG. 4, a case where a short-circuit failure is generated in one load in the first small load group 10 was described, however, in a case where a short-circuit failure is generated in one load in the second small load group 20, a waveform of the current $I_3$ in the third small load group 30 becomes a waveform which is similar to a waveform when a short-circuit failure is generated in one load in the first small load group 10, and based on a signal of the current detecting sensor CT in FIG. 3, that is, a signal of the current detecting sensor CT which detects the current $I_3$ in the third small load group 30, occurrence of an abnormality can be determined by the current abnormality detecting part 5.

Further, in a case where a short-circuit failure is generated in one load in the third small load group 30, a waveform of $I_3$ becomes a waveform shown as $I_1$ in FIG. 4, and a waveform of $I_1$ and that of $I_2$ become a waveform shown as $I_2$ in FIG. 4. In the $I_3$, a current flows into a load having a short-circuit failure so as to generate a rush current, based on a signal of the current detecting sensor CT in FIG. 3, that is, a signal of the current detecting sensor CT which detects the current $I_3$ in the third small load group 30, occurrence of an abnormality can be determined by the current abnormality detecting part 5.

As above-mentioned, according to Embodiment 2 of this invention, in a device in which a plurality of capacitive loads are connected in parallel, a load group which is a block of a plurality of capacitive loads is divided into three small load groups, that is, in FIG. 3, the load group is divided into the first load group 10, the second load group 20 and the third small load group 30, by detecting a current which flows in at least one small load group at a side which is closer to the load side than a branch point 4 by which a current from the AC power source 1 is separately supplied to three small load groups, when an abnormality of a short-circuit failure in any small load group is generated, the abnormality can be determined. Further, even if the number of small load groups are increased, an abnormality of a short-circuit failure can be determined in the same way. When the number of small load groups is more than two, that is, the number of small load groups is plural; the effect of this invention can be obtained. Further, as the number of loads in all load groups, any number of load groups in which each load group has a plurality of loads may be acceptable.

Embodiment 3

Figure 5:
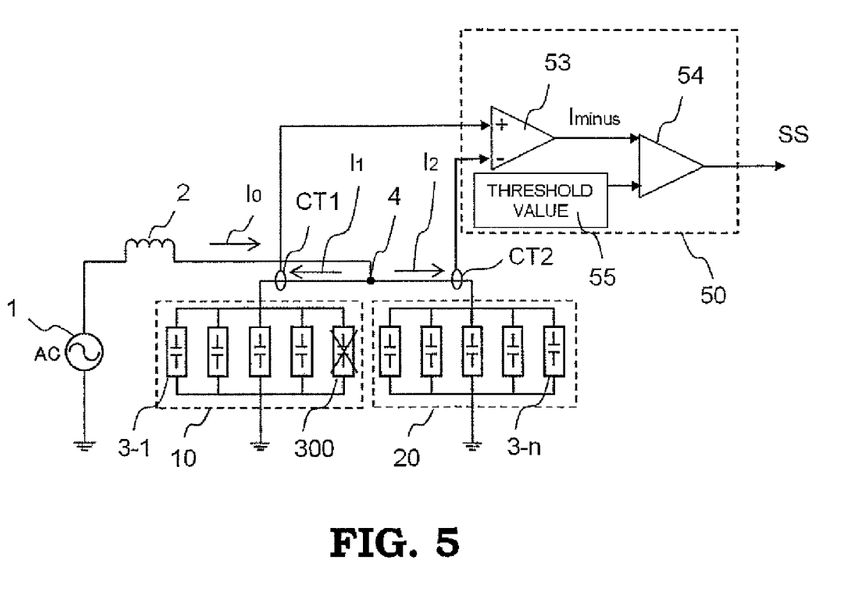
FIG. 5 is a circuit diagram showing the outline configuration of a device having capacitive loads according to Embodiment 3 of this invention.

FIG. 5 is a circuit diagram showing the outline configuration of a device having capacitive loads according to Embodiment 3 of this invention. In FIG. 5, the reference character which is same as that of FIG. 1 shows the same part or a corresponding part. An AC power source 1, a first small load group 10, a second small load group 20 and a branch point 4 in FIG. 5 are same as those in FIG. 1. In Embodiment 3, two current detecting sensors, that is, a current detecting sensor CT 1 which detects a current which flows in the first small load group 10 and a current detecting sensor CT 2 which detects a current which flows in the second small load group 20 are provided. In a current abnormality detecting part 50, by a differential amplifier 53, Iminus which is the difference between a current detecting signal of the current detecting sensor CT1 and that of the current detecting sensor CT2 is obtained, the obtained Iminus and a predetermined threshold value are compared by a comparator 54, and in a case where the Iminus is larger than the predetermined threshold value, an abnormality occurrence signal SS is outputted.

Figure 6:
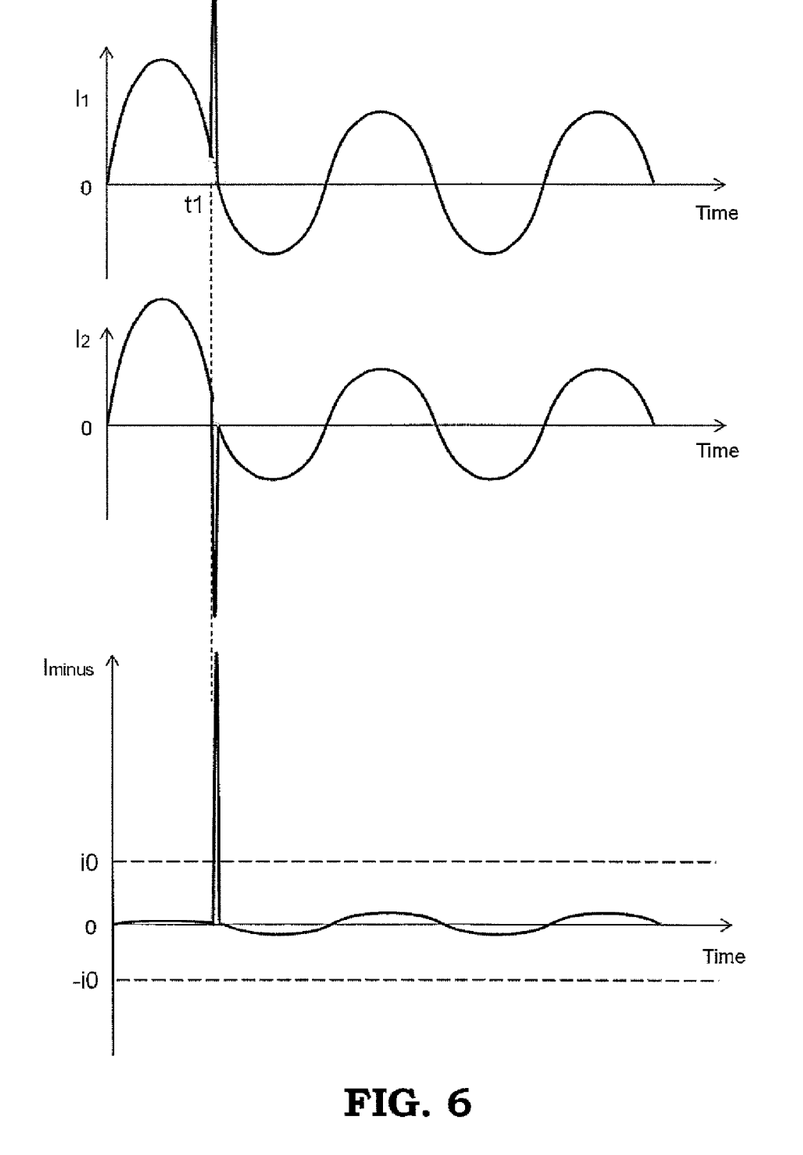
FIG. 6 is a schematic diagram for describing an operation of the device having capacitive loads according to Embodiment 3 of this invention.

FIG. 6 shows current waveforms in a case where a load 300 which is one load of the small load group 10 is short-circuited at time t1. In FIG. 6, from the top, a waveform of the current $I_1$ of the first small load group 10, that of the current $I_2$ of the second small load group 20, and that of Iminus which is the difference between the current $I_1$ and the current $I_2$ are shown, respectively. Before time t1, in the first small load group 10 and the second small load group 20, a current having approximately the same phase and the same value flows, respectively. Therefore, the output Iminus of the differential amplifier 53 which is the difference between the two currents is approximately zero. When a short-circuit current flows in the load 300 at time t1, the direction of the current $I_1$ which flows in the first small load group 10 and that of the current $I_2$ which flows in the second small load group 20 is opposite. Therefore, Iminus which is the difference between two currents has a large value. By comparing the Iminus and a predetermined threshold value i0 (shown by a horizontal broken line in a waveform diagram of Iminus in FIG. 6) with the comparator 54, an abnormality can be detected so as to output an abnormality occurrence signal SS.

Figure 7:
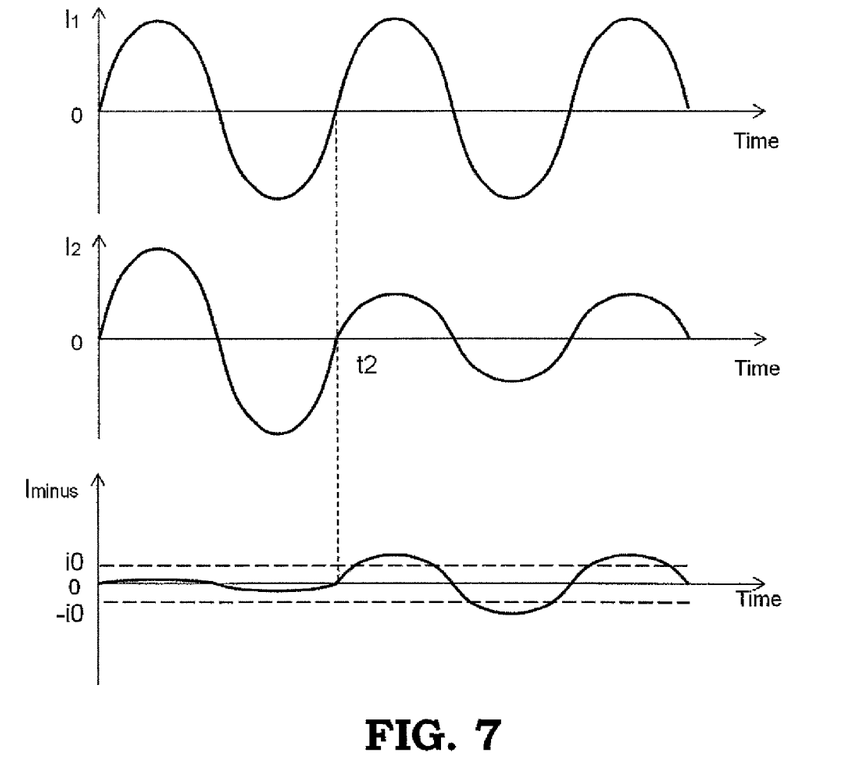
FIG. 7 is a schematic diagram for describing another operation of the device having capacitive loads according to Embodiment 3 of this invention.

Further, not only in a case where some loads are short-circuited, but also in a case where a load is failed due to some causes and a current waveform of a current which flows in the failed load becomes different from a waveform of a current which flows in other loads, an abnormality can be detected. An example of the above-mentioned is shown in FIG. 7. It is supposed such that in the second small load group 20, at time t2, an abnormality of a load is generated due to some causes and a current is decreased. That is, in a case where a waveform of a current which flows in the second small load group 20 is the waveform $I_2$ shown in FIG. 7, Iminus which is the difference between the current in the first small load group 10 and the current $I_2$ in the second small load group is almost zero before time t2 as shown in a waveform of Iminus shown in FIG. 7, however, after time t2, Iminus has a value. By comparing the Iminus and a predetermined threshold value i0 (shown by a horizontal broken line in a waveform diagram of Iminus in FIG. 7) with the comparator 54, an abnormality can be detected so as to output an abnormality occurrence signal SS.

Further, in a case where a load is normally operated, it is conceived such that the difference of currents does not become zero due to various causes. For example, due to causes such as manufacturing variations of loads, it is conceived such that a current which flows in the first small load group 10 and a current which flows in the second small load group 20 are slightly different. Further, it is conceived such that the sensitivity of the current detecting sensor CT1 and that of the current detecting sensor CT2 is slightly different. As countermeasures for the above-mentioned, commonly-used, various compensation measures can be performed as follows. Gains of two input terminals of the differential amplifier 53 are made different so as to make the Iminus which is outputted by the differential amplifier 53 zero when loads are normal. Or an output of the current detecting sensor CT1 and that of the current detecting sensor CT2 are inputted once to each amplifier whose gain can be changed, and then the gain of each amplifier is adjusted. Or in a case where a current detecting sensor is a current transformer, a resistor which receives an output of a current transformer is adjusted as a variable resistor. Further, as loads are capacitive loads, with respect to imbalance due to manufacturing variations of loads, imbalance of load currents between small load groups can be adjusted by inserting a capacitive load in parallel such as a dummy capacitor to a small load group having a smaller capacity. Or it is conceived such that characteristics of two small load groups 10 and 20 are non-linear, and the non-linearity is different. In this case, it is conceived such that an output of each current detecting sensor is amplified by each non-linear amplifier, respectively, and each output is linearized, and then, the each output is differentially amplified. It is needless to say that imbalance of the above-mentioned small load groups and current detecting sensors can be compensated according to following embodiments when needed.

As above-mentioned, in Embodiment 3, by obtaining Iminus which is the difference between the current $I_1$ of the first small load group 10 and the current $I_2$ of the second small load group 12, a large signal can be obtained only at an abnormal occurrence. Consequently, an abnormality can be detected with extremely high accuracy.

Embodiment 4

Figure 8:
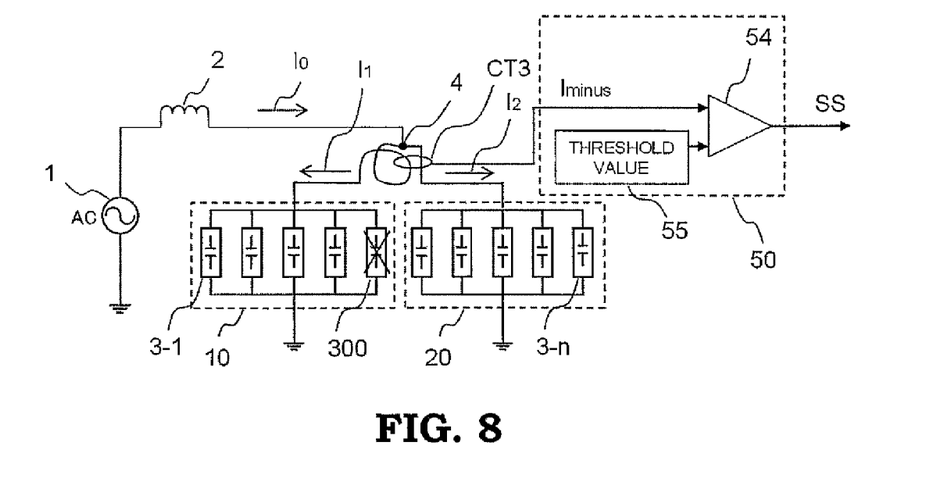
FIG. 8 is a circuit diagram showing the outline configuration of a device having capacitive loads according to Embodiment 4 of this invention.

FIG. 8 is a circuit diagram showing the outline configuration of a device having capacitive loads according to Embodiment 4 of this invention. In FIG. 8, the reference character which is same as that of FIG. 1 shows the same part or a corresponding part. An AC power source 1, a first small load group 10, a second small load group 20 and a branch point 4 in FIG. 8 are same as those in FIG. 1. In Embodiment 4, Iminus which is the difference between a current $I_1$ which flows in the first small load group 10 and a current $I_2$ which flows in the second small load group 20 is outputted by a current detecting sensor CT3 itself. When a current detecting sensor CT3 is a current transformer and an input of the current transformer is an input so as to make the direction of the current $I_1$ and that of the current $I_2$ opposite, the Iminus which is the difference between the current $I_1$ and the current $I_2$ appears in an output of the current transformer. The output Iminus is compared to a predetermined threshold value by a comparator 54, and in a case where the Iminus is larger than the threshold value, an abnormality occurrence signal SS is outputted.

Figure 9:
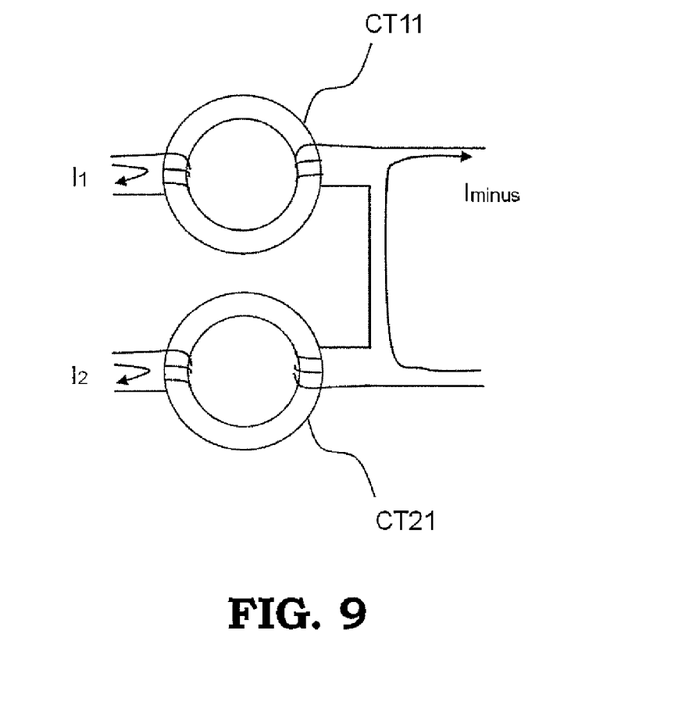
FIG. 9 is a diagram showing the details of another current detecting sensor in the device having capacitive loads according to Embodiment 4 of this invention.

FIG. 9 is a diagram showing another current detecting sensor according to Embodiment 4 of this invention. In FIG. 8, Iminum which is the difference between the current $I_1$ and the current $I_2$ is outputted by one current transformer. However, as shown in FIG. 9, by connecting an output of a current transformer CT11 which is a current detecting sensor which detects a current $I_1$ and an output of a current transformer CT22 which is a current detecting sensor for detecting a current $I_2$ in inverted phase and in series, a current waveform which is proportional to the Iminus which is the difference of the current $I_1$ and the current $I_2$ as an output can be obtained. The output signal is compared to a predetermined threshold value by a comparator 5 which is the same as that in FIG. 8, in a case where the Iminus is larger than the threshold value, an abnormality occurrence signal SS is outputted.

As above-mentioned, in Embodiment 4, the Iminus which is the difference between the current $I_1$ which flows in the first small load group 10 and the current $I_2$ which flows in the second small load group 20 is outputted by a current detecting sensor itself, therefore, it is not necessary to provide a differential amplifier. Consequently, an abnormality can be detected with high accuracy by a simple configuration.

Embodiment 5

Figure 10:
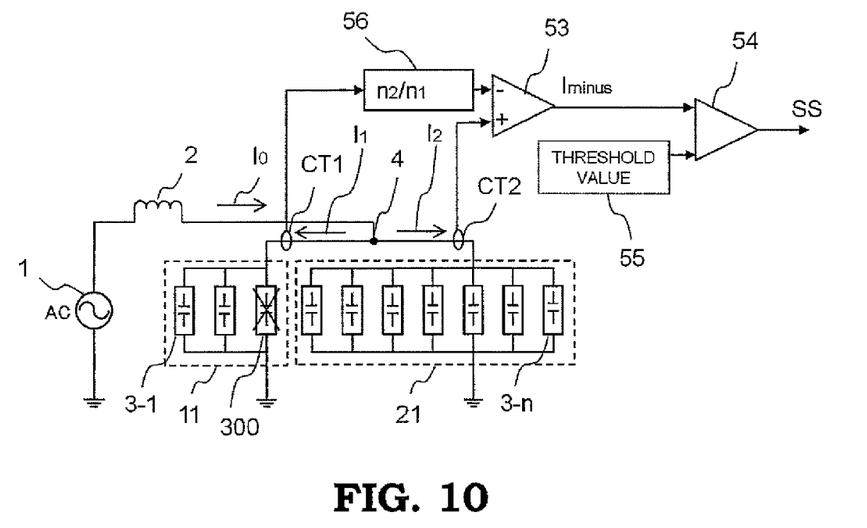
FIG. 10 is a circuit diagram showing the outline configuration of a device having capacitive loads according to Embodiment 5 of this invention.

FIG. 10 is a circuit diagram showing the outline configuration of a device having capacitive loads according to Embodiment 5 of this invention. In FIG. 10, the reference character which is same as that of FIG. 8 shows the same part or a corresponding part. In Embodiment 3 and Embodiment 4, the number of loads in the first small load group 10 is same as that in the second small load group 20, and a current which flows in the first small load group 10 is made to be same as a current which flows in the second small load group 20 in normal operation. In Embodiment 5, the number of loads in a first small load group 11 is different from that in a second small load group 21. As above-mentioned, even in a case where the number of loads is different, and currents which flow in both of load groups are different, by making either of an output to be same as that of other output using a multiplier so as to obtain the difference between the outputs, a current waveform having the same difference as that in Embodiment 4 can be obtained.

For example, as shown in FIG. 10, in a case where the number of loads in the first small load group 11, n1, is 3 and the number of loads in the second small load group 21, n2, is 7, by multiplying an output of a current detecting sensor CT1 which detects a current $I_1$ which flows in the first small load group 11 n2/n1 times by an multiplier 56, that is, by multiplying 7/3 times, and then outputting the difference between the obtained output of the current detecting sensor CT1 and an output of the current detecting sensor CT2 which detects the current $I_2$ which flows in the second small load group 21 by a differential amplifier 53, in normal operation, an output of the differential amplifier can be made almost zero, and only in abnormality occurrence, an output can be obtained by the differential amplifier and an abnormality can be detected.

Further, even in a case where a difference output is obtained by a current detecting sensor itself which is shown in Embodiment 4, an output in normal operation can be made to be almost zero by making a ratio of detecting sensitivity of the current $I_1$ to detecting sensitivity of the current $I_2$ to be a ratio of the number of loads in each small load group, therefore, an output can be obtained only in abnormality occurrence. For example, in a case where a current detecting sensor is a current transformer, by making a turn ratio in which the current $I_1$ is an input and a turn ratio in which the current $I_2$ is an input to be different in a ratio of the number of loads in each small load group, an output in normal operation can be made to be almost zero.

Embodiment 6

Figure 11:
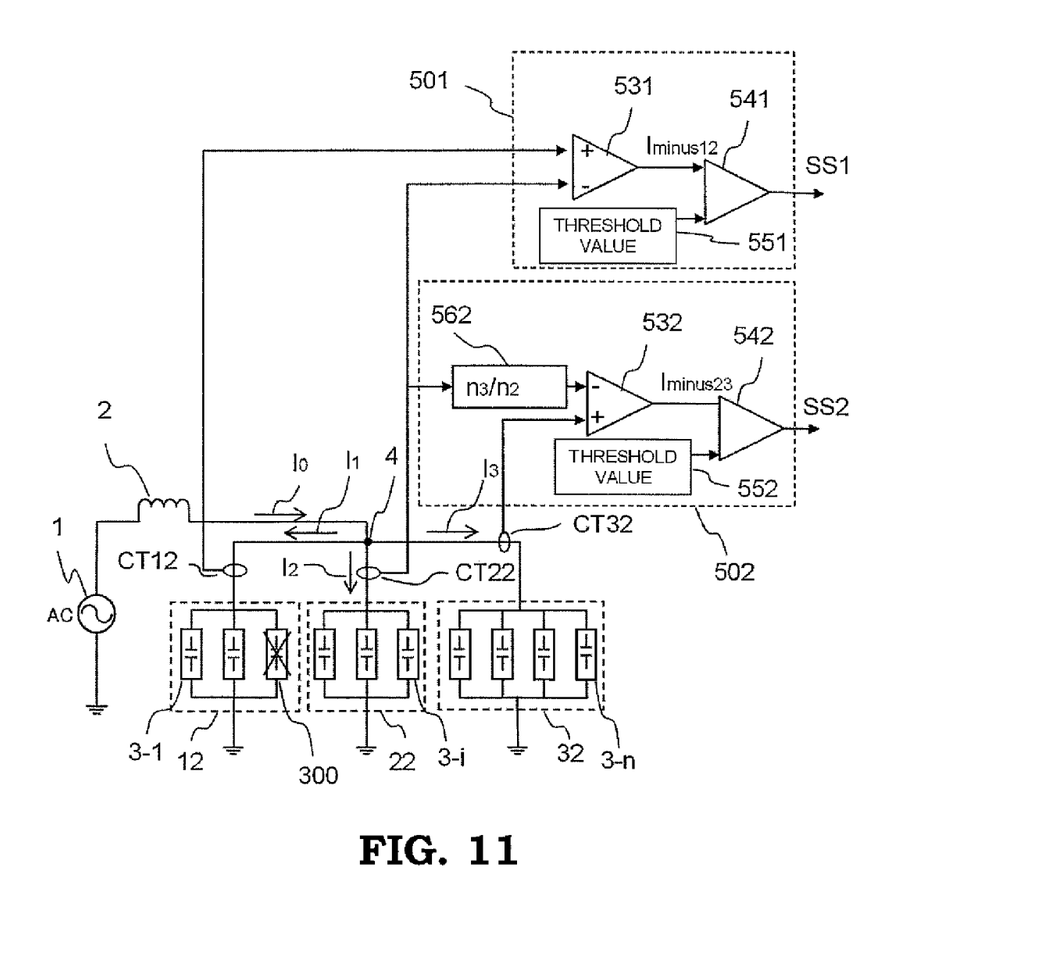
FIG. 11 is a circuit diagram showing the outline configuration of a device having capacitive loads according to Embodiment 6 of this invention.

FIG. 11 is a circuit diagram showing the outline configuration of a device having capacitive loads according to Embodiment 6 of this invention. In FIG. 11, the reference character which is same as that of FIGS. 1 to 10 shows the same part or a corresponding part. In Embodiments 3 to 5, a load group is divided into two small load groups, and based on a signal of difference of a current which flows in each load group, an abnormality is detected, and however, the number of division of load group is not limited to two. In Embodiment 6, a small load group is divided into three small load groups, that is, a first small load group 12, a second small load group 22 and a third small load group 32.

A current $I_1$ which flows in the first small load group 12 is detected by a current detecting sensor CT12 and a current $I_2$ which flows in the second small load group 22 is detected by a current detecting sensor CT22, and by obtaining the difference of an output of both of two current detecting sensors by a differential amplifier 531, Iminus $1_2$ which is the difference between the current $I_1$ and the current $I_2$ is obtained. The Iminus 12 is compared to a threshold value 551 by a comparator 541, and in a case where the Iminus 12 is larger than the threshold value 551, an abnormality occurrence signal SS1 is outputted. The differential amplifier 531, the comparator 541 and the threshold value 551 constitute a first current abnormality detecting part 501. According to the above-mentioned configuration, in a case where a failure is generated in any of the first small load group 12, or a failure is generated in any of the second small load group 22, an abnormality occurrence signal SS1 is outputted.

Further, based on an output of the current detecting sensor CT 22 which detects the current $I_2$ which flows in the second small load group 22 and an output of the current detecting sensor CT 32 which detects the current $I_3$ which flows in the third small load group 32, Iminus 23 which is the difference between the current I2 and the current I3 is obtained. In a case where the number of loads in the second small load group 22, n2, is 3 and the number of loads in the third small load group 32, n3, is 4, by multiplying an output of the current detecting sensor CT22 which detects the current $I_2$ which flows in the second small load group 22 n3/n2 times by a multiplier 562, that is, by multiplying 4/3 times, and then obtaining the difference between the obtained output of the current detecting sensor CT22 and an output of the current detecting sensor CT32 which detects the current $I_3$ which flows in the third small load group 32 by a differential amplifier 532, Iminus 23 which is the difference of 4/3 times of the current I2 and the I2 can be obtained. The Iminus 23 is compared to a threshold value 552 by a comparator 542, and in a case where the Iminus 23 is larger than the threshold value 552, an abnormality occurrence signal SS2 is outputted. The multiplier 562, the differential amplifier 532, the comparator 542 and the threshold value 552 constitute a second current abnormality detecting part 502. According to the above-mentioned configuration, in a case where a failure is generated in any of the second small load group 22, or a failure is generated in any of the third small load group 32, an abnormality occurrence signal SS2 is outputted.

In a case where an abnormality occurrence signal SS1 is outputted from the first current abnormality detecting part 501, or in a case where an abnormality occurrence signal SS2 is outputted from the second current abnormality detecting part 502, that is, in a case where OR of the abnormality occurrence signal SS1 and the abnormality occurrence signal SS2 is obtained so as to output either of these signals, the device determines such that an abnormality is generated in a load and an output of the AC power source 1 is decreased or stopped.

As described in Embodiment 6, regarding the division number of small load group in whole of load group, it is not necessary to divide whole of load group into two small load groups and the whole of load group may be divided into any number of small load groups. An effect of this invention can be obtained by making the configuration of the device in which two currents which flow in two small load groups in the plural small load groups are detected so as to obtain the difference of the two currents. When the number of load groups is increased, it becomes easier to specify a part in which an abnormality is generated in the narrower area. On the contrary, in a case where the number of load groups is small, the configuration of a device becomes simple.

Embodiment 7

Figure 12:
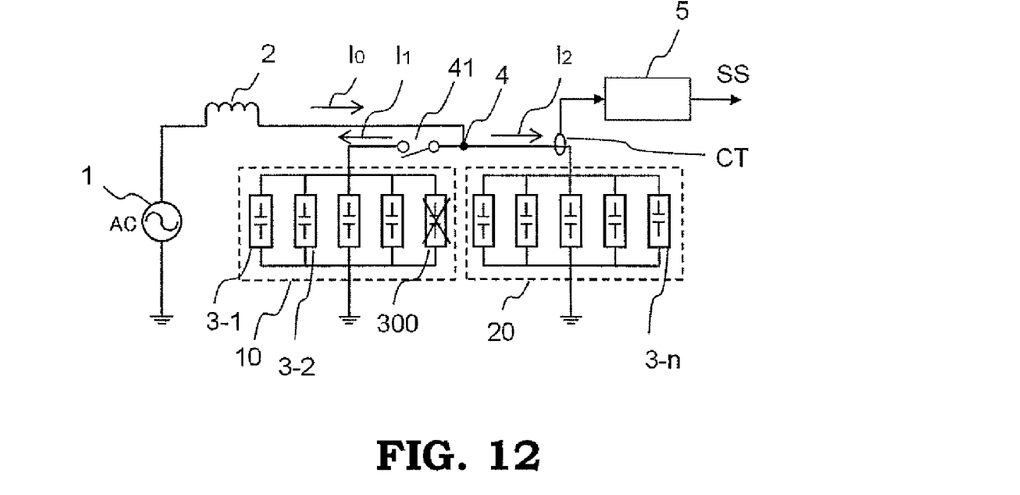
FIG. 12 is a circuit diagram showing the outline configuration of a device having capacitive loads according to Embodiment 7 of this invention.

FIG. 12 is a circuit diagram showing the outline configuration of a device having capacitive loads according to Embodiment 7 of this invention. In FIG. 12, the reference character which is same as that of FIG. 1 shows the same part or a corresponding part. In Embodiments 1 to 6, in a case where an abnormal current is detected, for example, control of stopping an output of an AC power source is performed, however, even when an output of the AC power source is stopped, in a case where a certain load becomes short-circuited, until charges which are stored in other capacitive loads is discharged completely, an outflow of charges from other capacitive loads is not stopped. In a case where the number of loads of small load groups is large, the charge amount may become a problem. Consequently, in Embodiment 7, a current interrupting element such as a switch 41 between a small load group 10 and a small load group 20 is provided. In a case where an abnormal current is detected, that is, in a case where an abnormality occurrence signal SS is outputted, an AC power source 1 is stopped, and the switch 41 is opened so as to interrupt the current. As a result, an outflow of charges from a small load group in which short-circuited load does not exist (as an example in FIG. 12, a small load group 20) can be prevented.

Figure 13:
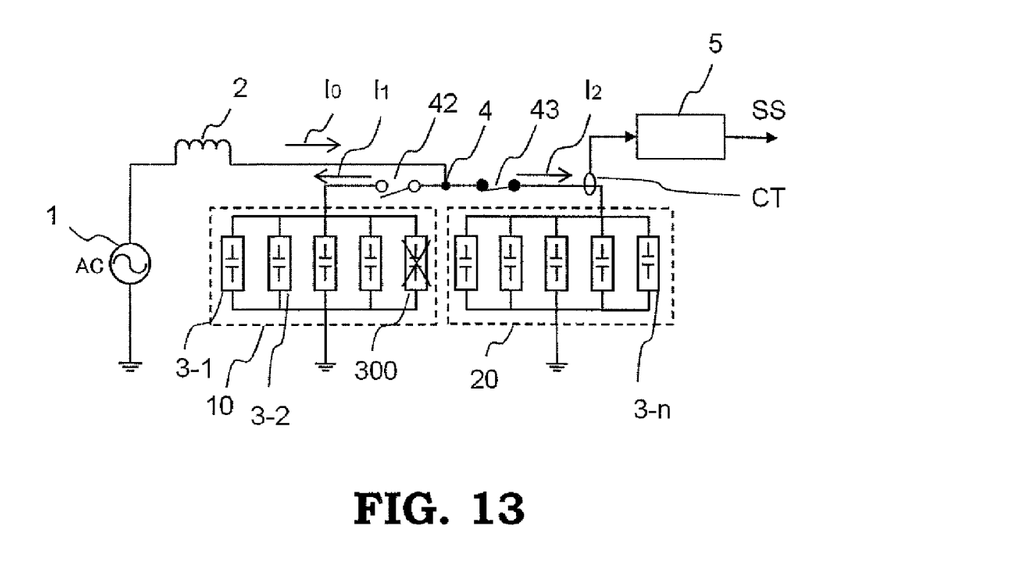
FIG. 13 is a circuit diagram showing the outline configuration of another device having capacitive loads according to Embodiment 7 of this invention.

FIG. 13 is a circuit diagram showing the outline configuration of another device having capacitive loads according to Embodiment 7 of this invention. In FIG. 13, the reference character which is same as that of FIG. 1 shows the same part or a corresponding part. In FIG. 13, a switch 42 and a switch 43 are provided at the side closer to each small load group than a branch point 4. A current abnormality detecting part 5 also detects a direction of an abnormal current, in a case where an abnormal current is detected; it is determined whether an abnormality is generated in either of a small load group 10 or a small load group 20, and then control is performed so as to open the switch which is provided at the side where the abnormality is generated, among the switch 42 and the switch 43. By controlling as above-mentioned, an outflow of charges from a small load group in which a short-circuited is not generated can be prevented, without stopping an AC power source 1, an operation of a small load group in which an abnormality is not generated can be continued. Further, the configuration in which a switch is inserted every small load group can be applied to a case in which more than three small load groups are provided as Example 6. Further, as the switch 41, 42, 43, etc., a current interrupting element which interrupts a current by itself such as fuse may be acceptable.

REFERENCE CHARACTERS

1: AC power source
3, 300, 3-1, 3-2, 3-$i$, 3-$n$: load
4: branch point
5, 50, 501, 502: current abnormality detecting part
10, 11, 12, 20, 21, 22, 30, 32: small load group CT1, CT2, CT3, CT11, CT12: current detecting sensor,
CT21, CT22, CT32: current detecting sensor
41, 42, 43: switch (current interrupting element)

The invention claimed is:

1. A device having capacitive loads in which a plurality of capacitive loads are connected in parallel, a current is supplied from an AC power source to a load group comprising the plurality of capacitive loads,
   wherein the load group is divided into a plurality of small load groups, and further including:
   a current detecting sensor for detecting a current which flows in at least one small load group at a side which is closer to the load side than a branch point at which the load group is divided into the plurality of small load groups, and
   a current abnormality detecting part for determining an abnormality of a load by detecting a rush current which flows between the plurality of small load groups and flows into a load which is shorted in a case where any of the capacitive loads is shorted during operation of the device having capacitive loads.

2. The device having capacitive loads as claimed in claim 1, wherein the load groups are divided into two small load groups,
   two current detecting sensors which detect a current which flows in each of the two load groups, respectively, are provided, and
   the current abnormality detecting part obtains a difference of output of the two current detecting sensors, and determines an abnormality is generated in a case where the current abnormality detecting part detects such that the difference of output is a rush current which flows into the load which is shorted.

3. A method for detecting an abnormality in a device having capacitive loads in which a plurality of capacitive loads which are connected in parallel and a current is supplied from an AC power source to a load group comprising the plurality of loads, the method comprising:
   dividing the load group into a plurality of small load groups; detecting a rush current which flows between the plurality of small load groups and flows into a load which is shorted, in a case where any of the capacitive loads is shorted during operation of the device having capacitive loads, and
   determining that an abnormality is generated in any load in the small load groups, based upon the detection.

4. The method for detecting an abnormality in a device having capacitive loads as claimed in claim 3,
   wherein the load group is divided into two small load groups, in a case where a difference of currents which flow in the two small load groups is obtained and it is detected such that the difference of two currents is a rush current into the load which is shorted, a determination is made that an abnormality is generated in the loads.

* * * * *